United States Patent [19]

Isono et al.

[11] Patent Number: 4,972,574
[45] Date of Patent: Nov. 27, 1990

[54] TABLE DRIVING APPARATUS

[75] Inventors: Tadao Isono, Kokubunji; Yasuaki Sekiguchi, Sayama, both of Japan

[73] Assignee: Mamiya Denshi Co., Ltd., Japan

[21] Appl. No.: 355,551

[22] Filed: May 23, 1989

[30] Foreign Application Priority Data

| Jun. 8, 1988 [JP] | Japan | 63-76176[U] |
| Aug. 3, 1988 [JP] | Japan | 63-103128[U] |
| Oct. 28, 1988 [JP] | Japan | 63-272493[U] |
| Jan. 17, 1989 [JP] | Japan | 64-8187 |

[51] Int. Cl.$^5$ ............................................. B23P 19/00
[52] U.S. Cl. .......................................... 29/740; 74/479
[58] Field of Search ................ 74/519, 479; 29/740

[56] References Cited

U.S. PATENT DOCUMENTS

| 4,341,128 | 7/1982 | Murakoshi et al. | 74/479 |
| 4,409,860 | 10/1983 | Moriyama et al. | 74/479 |
| 4,711,537 | 12/1987 | Schindl et al. | 74/479 |

Primary Examiner—P. W. Echols
Attorney, Agent, or Firm—Bruce L. Adams; Van C. Wilks

[57] ABSTRACT

Disclosed is a table driving apparatus adapted for use with an automatic mounting apparatus or assembling robot comprising a working table movable in at least one direction, and a direct-drive motor having a rotary arm. A mechanism is provided for mechanically coupling the working table and the rotary arm in such a manner that turning movement of the arm can be converted into linearly sliding movement of the working table along the one direction. The direct-drive motor is coupled with the working table with such a small compliance that the resonance frequency of a statem including the direct-drive motor and a load coupled therewith lies out of a frequency range within which the direct-drive motor is operable. This arrangement assures a rigid coupling between the firect-drive motor and the working table with a small compliance, so that the resonance frequency becomes muxh higher than otherwise coupled, thus enabling a stable and precise driving of the working table.

20 Claims, 6 Drawing Sheets

TABLE DRIVING APPARATUS

BACKGROUND OF THE INVENTION

1. Field of the Invention

This invention relates to a table driving apparatus, and more particularly to an apparatus for driving a working table in an X-Y direction to pick up or receive chip components which are to be mounted or assembled.

2. Description of the Prior Art

Such a working table, also called an X-Y table, is used in an automatic mounting apparatus for electric chip components such as transistors or capacitors and is usually driven in orthogonal directions (X and Y directions) in programmed sequence to pick up the chip components from a parts feeder and transport them to a printed circuit board for automatic mounting thereon (See, for example, U.S. Pat. No. 4,459,743). In another automatic mounting apparatus, the X-Y table carries a printed circuit board and moves to a predetermined position to receive thereon the chip components fed from the parts feeder. The working table can also be used with assembling robots for picking up the chip components and moving them to a predetermined position for assembling purposes.

The working or X-Y table is usually driven by means of X and Y drive motors through ball screws or belts. Such a working table driven by means of conventional motors requires many expensive parts of high precision and disadvantageously cause noise when they are driven. There is also a limit for the working table driven by means of the conventional motors when positioning accuracy is required or when movement at high speed is desired. For example, an assembling robot having a resolution of several microns and a moving speed of one meter per second can hardly be realized.

To overcome this drawback, a proposal has been made in which a direct-drive motor of a rotary type having a high resolution is used to drive the working table. When, however, the table is driven at high speed with high resolution using the direct-drive motor, there occurs another problem that an extraordinary oscillation or vibration takes place in a system including the direct-drive motor and a load coupled therewith because the dynamic characteristics of the direct-drive motor greatly depend upon a load coupled with it. To compensate for this oscillation, a filter is used in a driving circuit or a mechanical damper is incorporated in the system. These means are, however, less successful than expected because they need sophisticated adjustment.

It is therefore an object of the present invention to provide a table driving apparatus using a direct-drive motor which is capable of driving a working table with high resolution and high speed with simplified structure.

It is another object of the invention to provide a simple and stable table driving apparatus adapted for use with an automatic mounting apparatus or assembling robot.

SUMMARY OF THE INVENTION

According to the invention, a table driving apparatus adapted for use with an automatic mounting apparatus for chip components comprises a working table movable in at least one direction, a direct-drive motor having a drive shaft, an arm fixedly connected at one end to the drive shaft of the direct-drive motor, and a mechanism for mechanically coupling the working table and the arm in such a manner that turning movement of the arm can be converted into linearly sliding movement of the working table along the one direction. In the apparatus, the direct-drive motor is coupled with the working table with such a small compliance that the resonance frequency of a system including the direct-drive motor and a load coupled therewith lies out of a frequency range within which the direct-drive motor is operable.

With such an arrangement, a rigid coupling between the direct-drive motor and the working table with a small compliance is assured, so that the resonance frequency becomes much higher than otherwise coupled. This prevents the system comprised of the direct-drive motor and the load from oscillating near the resonance frequency, thus assuring a stable and precise driving of the working table. Further, the working table is coupled with the direct-drive motor without intermediate gears, so that the use of expensive parts can advantageously be eliminated with simplified structure and reduced noise.

Preferably, the resonance frequency is set to a frequency of, for example, about 200 Hz, exceeding a critical frequency at which the direct-drive motor without load delays about 90 degrees in closed-loop phase.

The mechanism for mechanically coupling the working table and the arm with such a small compliance is realized by a link or crank mechanism.

BRIEF DESCRIPTION OF THE DRAWINGS

The objects and features of the present invention will become more apparent from the accompanying drawings and the following detailed description of the invention.

DETAILED DESCRIPTION OF THE PREFERRED EMBODIMENTS

Figure 1:
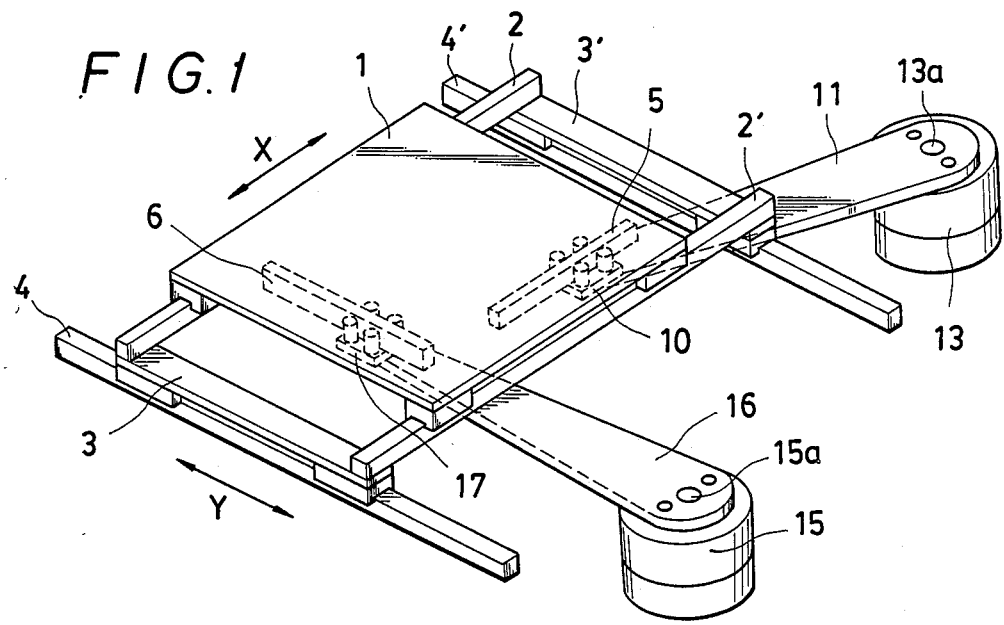
FIG. 1 is a schematic view showing a table driving apparatus according to the invention.

The invention will now be described more fully in connection with preferred embodiments referring to the drawings.

FIG. 1 shows schematically a table driving apparatus according to the invention including a working table 1 which is slidably supported on a pair of equally spaced guide rods 2 and 2' extending along an X direction. The guide rods 2 and 2' are connected at both ends to each other by connecting bars 3 and 3' which are also slidably supported on a pair of equally spaced guide rods 4 and 4' extending along a Y direction orthogonal to the X direction.

Figure 2:
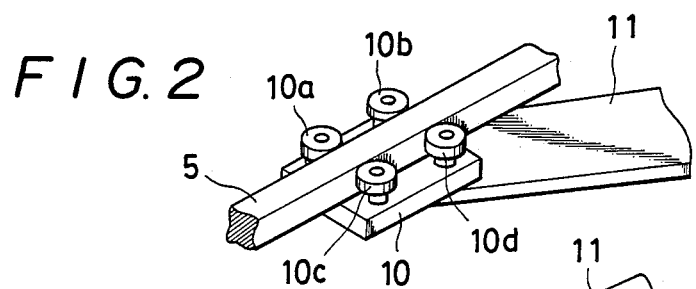
FIG. 2 is a schematic view showing a mechanism for linking a rotary arm and a working table in a table driving apparatus in FIG. 1.
Figure 3:
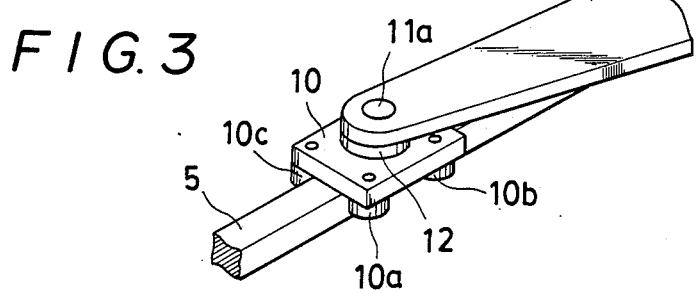
FIG. 3 is view of the link mechanism of FIG. 2 as seen from the other side.

The working table 1 is provided on its back side with driving rods 5 and 6 which are fixedly mounted thereon and extending along the X and Y directions, respectively. The driving rod 5 is coupled with an arm 11 through a link mechanism comprising a link plate 10 and four rollers 10a to 10d engaging with the driving rod 5 from both sides thereof, as shown in FIGS. 2 and 3. The arm 11 is connected at its one end to the link plate 10 through a rotary bearing 12 for bearing the arm 11 rotatably about an axis 11a and connected fixedly at the other end to a drive shaft 13a of a direct-drive motor 13 of a rotary type. A direct-drive motor is defined as a motor for driving a device or machine which is directly connected mechanically to the driving shaft of the motor without the use of belts or chains. Such a direct-drive motor is characterized by its high resolution, high speed and dust-proof structure. In the embodiments according to the invention, a direct-drive motor is used which is commercially available in the name of DINA-SERV manufactured by YOKOGAWA PRECISION, Tokyo.

When the direct-drive motor 13 is driven, the arm 11 effects rotary or turning movement which is converted into linearly sliding movement of the working table 1 along the Y direction because the driving rod 5 fixed to the working table 1 is mechanically connected to the arm 11 of the direct-drive motor 13 through the link mechanism comprising the link plate 10 and four rollers 10a to 10d as shown in FIGS. 2 and 3.

For sliding movement along the X direction there is provided a similar direct-drive motor 15 of the same rotary type which fixedly supports an arm 16 at its driving shaft 15a and serves to slide the working table 1 along the X direction by means of a link mechanism 17 for coupling the arm 16 with the driving rod 6 of the working table 1 so as to convert the rotary movement of the arm 16 into the linearly sliding movement of the working table 1.

The working table 1 is used, for example, in an automatic mounting apparatus for electric chip components such as transistors or capacitors and driven in the X-Y direction in programmed sequence by means of the direct-drive motors 13 and 15 to pick up the chip components with the aid of a suction bit from a parts feeder and transport them to a printed circuit board (these units or devices not shown) for automatic mounting thereon. In an automatic mounting apparatus of another type, the working table carries a printed circuit board and is caused to move to a predetermined position by the direct-drive motors 13 and 15 to receive thereon the chip components fed from the parts feeder.

According to the invention, the direct-drive motor is coupled with the working table with such a small compliance that the resonance frequency of a system including the direct-drive motor and a load coupled therewith lies out of a frequency range within which the direct-drive motor is operable.

Figure 4:
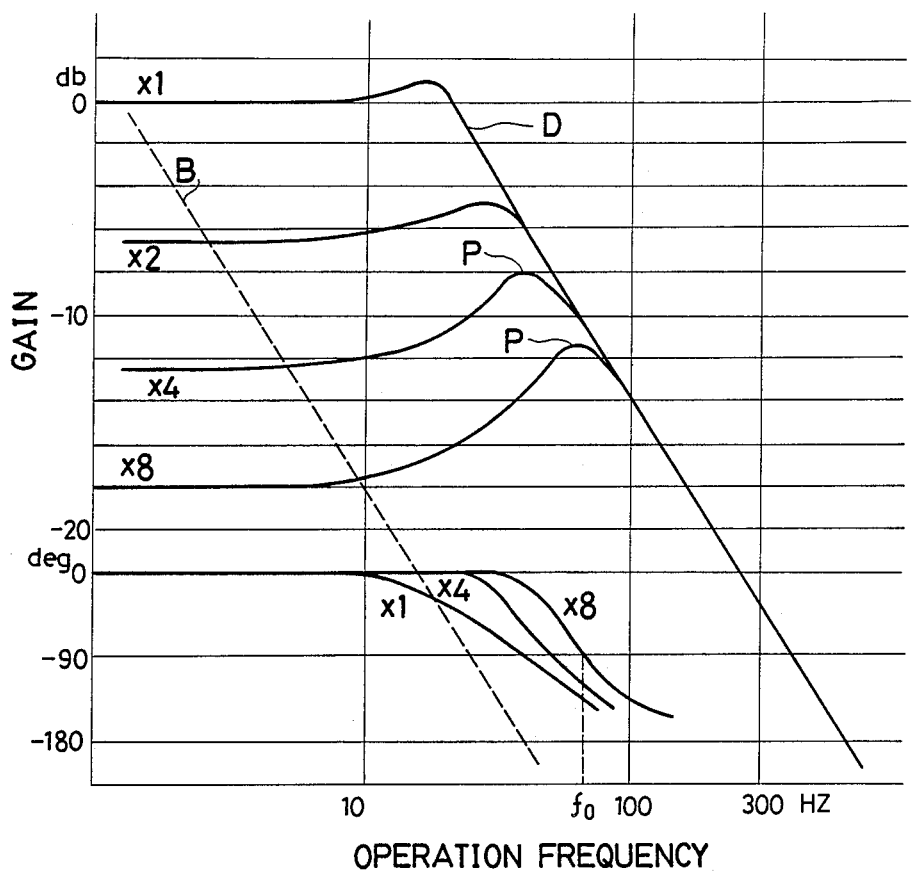
FIG. 4 is a graph showing closed-loop characteristics of a direct drive motor.

FIG. 4 shows closed-loop characteristics of the direct-drive motor with parameters of an operation frequency of the direct-drive motor and a closed-loop gain. The direct-drive motor itself has only the inertia load and shows a decay D of −20 dB per decade. A signal is negatively fed back to provide closed-loop characteristics as shown in FIG. 4. With an increasing gain from x1 to x8, a frequency band becomes wide with a remarkable peak P appearing at a high frequency. With an additional increase in gain, a system including the direct-drive motor begins to oscillate. The oscillation takes place, as is known, when the feed-back signal delays more than 90 degrees in phase with a loop gain of one. A deviation in phase is brought primarily by an encoder and an amplifier employed in the direct-drive motor. The frequency of at which the phase in the closed loop delays 90 degrees is called a critical frequency.

Preferably, the gain is increased with a peak of 2 to 3 dB so as to provide as a frequency band as possible in order to constitute a stable system which can be set up in a short time. The direct-drive motor with such characteristics is coupled, for example, with an inertia load fifteen times as great as that of the direct-drive motor. This causes the characteristics to be shifted to a line B corresponding to a parallel down-shift by a factor of 23.5 dB (fifteen times) relative to a straight line D having a gradient of −20 dB per decade. Resultant dynamic characteristics depend primarily upon how the load is coupled with the direct-drive motor. The coupling of the load with the direct-drive motor by means of belts or screws forms a resonance circuit having a resonance frequency defined by a system comprised of the direct-drive motor, load and longitudinal elasticity of the belt. An oscillation is apt to occur, if the resonance frequency approaches to the critical frequency of the direct-drive motor without load because a sophisticated change in phase takes place and a load changes rapidly.

To overcome such an oscillation, the direct-drive motor in the embodiment of the invention is coupled with the working table using the link mechanism as shown in FIGS. 1 to 3. This coupling assures a small compliance (i.e. rigid coupling), so that the resonance frequency becomes much higher than otherwise coupled. Preferably, the resonance frequency lies, for example, at a frequency of about 200 Hz out of a frequency range within which the direct-drive motor is operable, that is at a frequency exceeding a critical frequency at which the direct-drive motor without load delays about 90 degrees in closed-loop phase. Thus, the direct-drive motor is coupled with the working table by means of the link mechanism with a small compliance, so that a stable and precise table driving apparatus is provided with reduced noise. For the use of a link having a radius of 260 mm and the above-mentioned direct-drive motor, a working table with a repetition accuracy of 2.5 micrometers and a maximum speed of 3.5 m/s was obtained.

Figure 5:
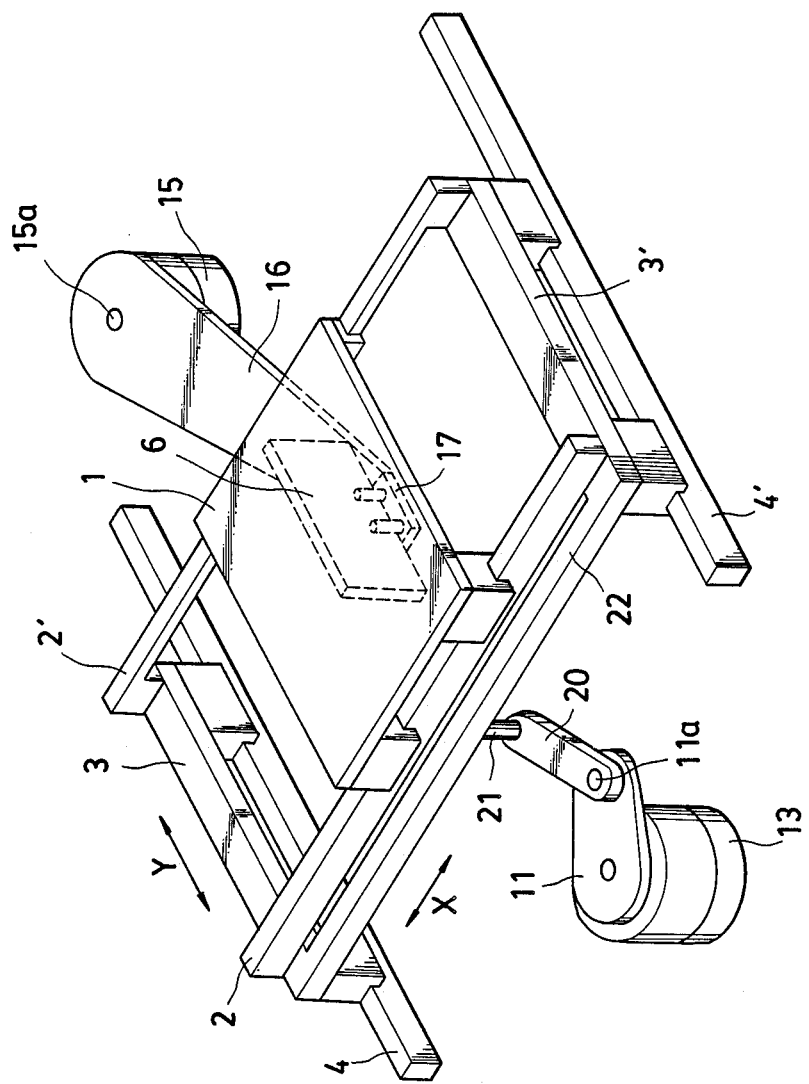
FIGS. 5 and 6 are schematic views each showing another embodiment of a table driving apparatus according to the invention.

Such a small compliance in coupling between the direct-drive motor and the working table can also be realized by a crank mechanism as shown in FIG. 5 instead of using the link mechanism as shown in FIG. 1. In FIG. 5, the same or similar portions are provided with the same reference numerals. In this embodiment, the direct-drive motor 13 is coupled with the working table 1 by means of a crank mechanism including a crank rod 20 connected to the end 11a of the arm 11 and a drive pin 21 connected at one end to the crank rod 20 and at the other end to a frame 22 of the working table 1. This arrangement also enables the working table 1 to be driven along the Y direction in response to the rotation of the direct-drive motor 13 with the same effects as those in the embodiment in FIG. 1. In this embodiment, a maximum stroke of the working table along the Y direction is defined by the radius the crank rod draws, so that limiters or sensors for limiting the movement of the working table can be eliminated.

Figure 6:
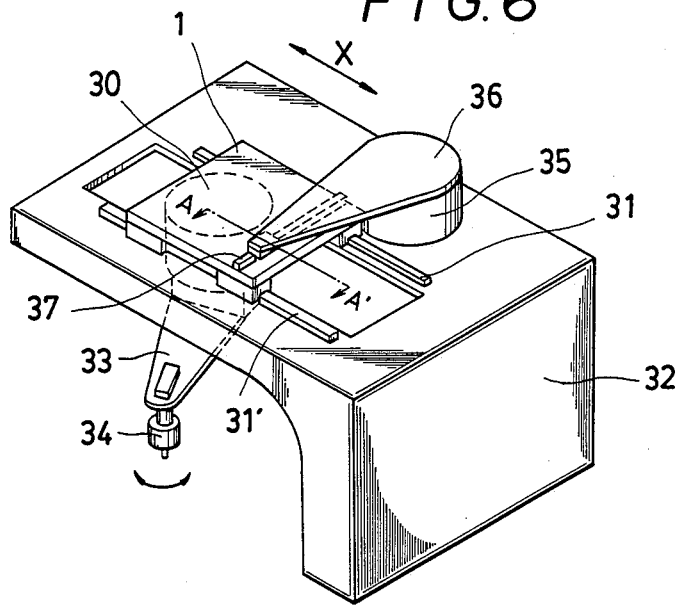
Figure 7:
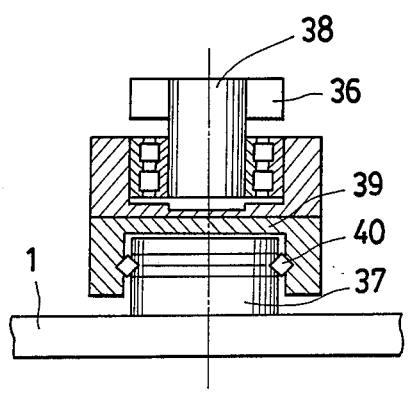
FIG. 7 is a cross section taken along the line A-A' in FIG. 6.

FIG. 6 shows another embodiment of the invention adapted for use with an assembling robot in which the working table 1 carries a direct-drive motor 30 and is slidably mounted on a pair of equally spaced guide bars 31 and 31' fixed to a base 32. The direct-drive motor 30 is provided with an arm 33 which carries at its top end a hand 34 for picking up chip components to be assembled. The working table 1 is slidable along the X direction by means of a direct-drive motor 35 having an arm 36 fixedly connected thereto, which is in turn coupled with a drive rod 37 mounted on the working table 1 through a mechanism as shown in FIG. 7. The arm 36 is connected at the end to a shaft 38 for coupling the arm 36 and a slider 39, which is coupled with the drive rod 37 on the working table 1 by means of a roller bearing 40 in such a manner that the turning movement of the arm 36 can be converted into linearly sliding movement of the working table 1 along the X direction. This arrangement also assures a small compliance in coupling the working table with the direct-drive motor 35, thus shifting a resonance frequency of the whole system to a high frequency at which the direct-drive motor cannot operate. Further, the arm 36 is connected to the drive rod 37 through the ball bearing 40, so that a stress appearing in the coupling portion can be absorbed sufficiently with a small friction load.

The same applies for the direct-drive motor 30 because of no elastic coupling causing less or small compliance.

Figure 8:
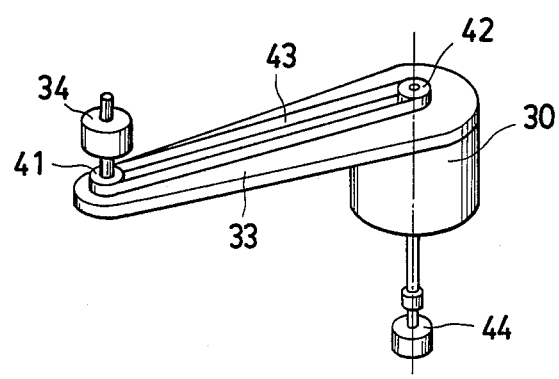
FIG. 8 is a schematic view showing another embodiment for driving a hand employed in an apparatus in FIG. 6.

In the embodiment in FIG. 6, the hand 34 rotates as the arm 33 rotates. To prevent this, the hand 34 may be rotatably mounted on the arm 33 as shown in FIG. 8 in which the hand 34 is driven through a pair of pulleys 41 and 42 and a belt 43 independently of the rotation of the direct-drive motor 30 so that the hand 34 takes a fixed position relative to the arm 33. Alternatively, the hand can be rotated by means of a motor 44 of a conventional type through the pulleys 41 and 42 and the belt 43 so that the hand 34 may take any angular position relative to the arm 33.

In order to improve a vibration-proof structure in the working table to prevent the vibration of the coupling portions and the oscillation of the direct-drive motor, it would be preferable that the direct-drive motor is mounted on a support base through a vibration-proof structure.

Figure 9:
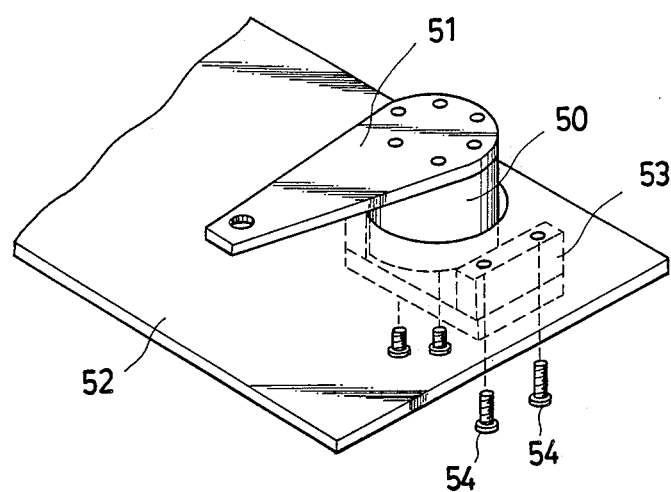
FIG. 9 is an illustrative view showing how the direct-drive motor is mounted on a frame base.
Figure 10:
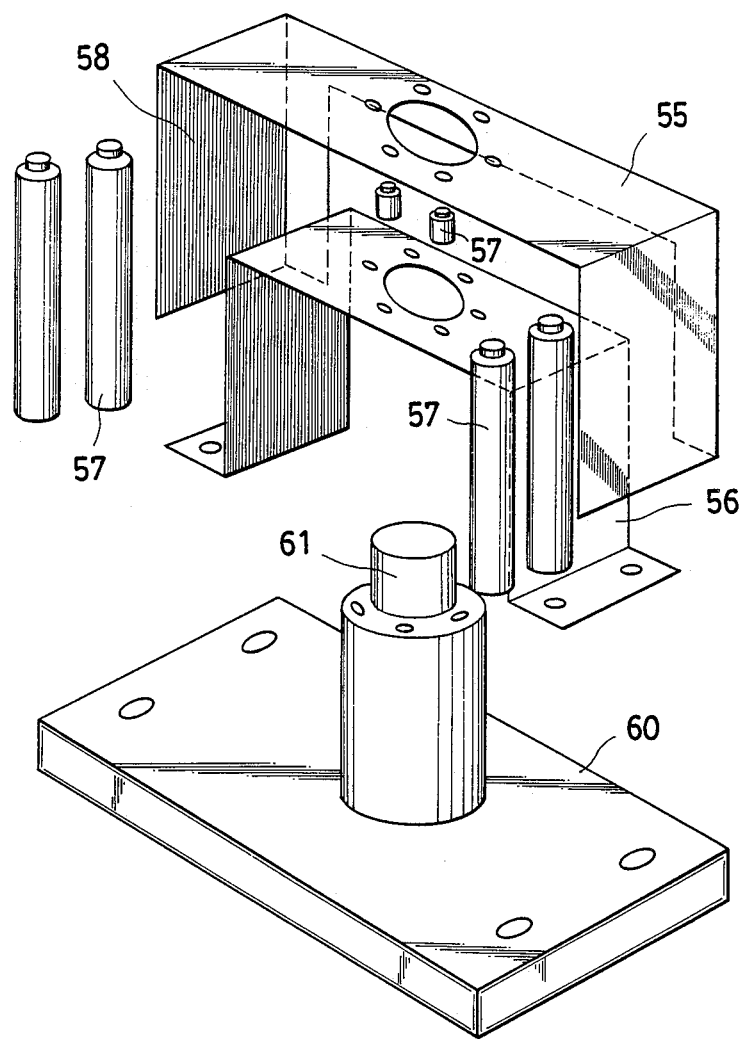
FIG. 10 is an illustrative view showing a mount for mounting the direct-drive motor on a base frame.

In FIG. 9, a direct-drive motor 50 having a rotary arm 51 is mounted on a frame base 52 through a mount 53 and fixed thereto by means of screws 54. The mount 53 is of a vibration-proof structure and is preferably manufactured as shown in FIG. 10. The mount 53 is made of a casing comprised of two sheets of metallic plates 55 and 56 which are connected by a plurality of connecting rods 57. A space 58 defined by the metallic plates 55 and 56 is filled with a filler made of a mixture of pulverized granite and epoxy resin with a mixture ratio of 8 to 2 or 9 to 1. Upon injection of the filler, the metallic plate 56 is pressed against a jig 60 by means of screws or vacuum suction so that the mounting portion 61 of the metallic plate can be made flat. A portion 61 of the jig 60 is covered with a material such as teflon so as not to be adhesive to the filler.

Figure 11:
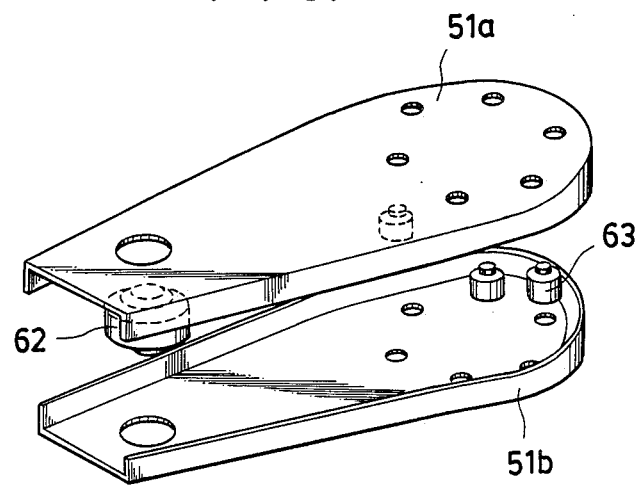
FIG. 11 is an illustrative view showing a rotary arm in disassembled state.

FIG. 11 shows a vibration-proof structure employed in the rotary arm 51. The arm is made of a casing comprised of two sheet of metallic plates 51a and 51b connected by a plurality of connecting rods 62 and 63. A space defined by the metallic plates 51a and 51b is filled with the same filler as in FIG. 10.

With such a structure, any vibration occurring can be successfully absorbed to provide a vibration-proof structure. Mounting holes in the casing can be formed precisely and easily because it is made of metal. The mounting surface can be made flat with the aid of the jig. The filler makes it possible to reduce a vibration several times as compared with metal. Further, a mixture ratio of the filler can be adjusted so that its coefficient of linear expansion is made substantially equal to that of iron or aluminum.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention should not be limited to the particular embodiment disclosed as the best mode contemplated for carrying out the invention, but that the invention will include all embodiments falling within the scope of the appended claims.

What is claimed is:

1. A table driving apparatus comprising:
    a working table movable in at least one direction;
    a direct-drive motor having a drive shaft;
    an arm fixedly connected at one end to the drive shaft of the direct-drive motor; and
    a mechanism for mechanically coupling the working table and the arm in such a manner that turning movement of the arm can be converted into linearly sliding movement of the working table along the one direction;
    wherein the direct-drive motor is coupled with the working table with such a small compliance that the resonance frequency of a system including the direct-drive motor and a load coupled therewith lies out of a frequency range within which the direct-drive motor is operable.

2. A table driving apparatus as set forth in claim 1, wherein the resonance frequency is set to a frequency exceeding a critical frequency at which the direct-drive motor without load delays about 90 degrees in closed-loop phase.

3. A table driving apparatus as set forth in claim 1, wherein said mechanism is realized by a link or crank mechanism.

4. A table driving apparatus as set forth in claim 1, further comprising a direct-drive motor for driving the working table into a direction orthogonal to said one direction.

5. A table driving apparatus as set forth in claim 1, wherein said direct-drive motor is mounted through a vibration-proof casing.

6. A table driving apparatus as set forth in claim 5, wherein said casing comprising two sheets of metallic plates into which a filler of pulverized granite and epoxy resin is injected with a predetermined mixture ratio.

7. A table driving apparatus comprising:

a working table movable in at least one direction;
a first direct-drive motor mounted on the working table and having a drive shaft;
an arm fixedly connected at one end to the drive shaft of said first direct-drive motor and at the other end to a hand for picking up chip components to be assembled;
a second direct-drive motor having a drive shaft; and
a mechanism for mechanically coupling the working table and an arm associated with the second direct-drive motor in such a manner that its turning movement can be converted into linearly sliding movement of the working table along said one direction;
wherein the second direct-drive motor is coupled to the working table with such a small compliance that the resonance frequency of a system including the second direct-drive motor and a load coupled therewith lies out of a frequency range within which the second direct-drive motor is operable.

8. A table driving apparatus as set forth in claim 7, wherein the first direct-drive motor is coupled with the hand with such a small compliance that the resonance frequency of a system including the first direct-drive motor and a load coupled therewith lies out of a frequency range within which the first direct-drive motor is operable.

9. A table driving apparatus as set forth in claim 7, wherein the hand is fixed in angular position relative to the arm associated with the first direct-drive motor independently of its rotation.

10. A table driving apparatus as set forth in claim 7, further comprising a third motor for driving the hand to any angular position relative to the arm associated with the first direct-drive motor.

11. A table driving apparatus comprising:
a working table movable in at least one direction;
direct-drive motor means having an operating frequency range and a drive shaft;
means for mechanically coupling the working table and the drive shaft to convert rotary movement of the drive shaft into linear moment of the working table along the at least one direction; and
wherein the coupling means is sufficiently stiff to establish a resonance frequency of a system comprised of the direct-drive motor means and a load coupled therewith outside of the operating frequency range of the direct-drive motor means.

12. A table driving apparatus as set forth in claim 11, wherein the direct motor means has a critical frequency at which the direct-drive motor means without load delays about 90 degrees in a closed-loop phase, and wherein the resonance frequency is greater than the critical frequency.

13. A table driving apparatus as set forth in claim 11, wherein said coupling means comprises one of a link and a crank mechanism.

14. A table driving apparatus as set forth in claim 11, further comprising second direct-drive motor means for driving the working table in a direction orthogonal to said at least one direction.

15. A table driving apparatus as set forth in claim 11, further comprising a vibration-proof casing for mounting said direct-drive motor means.

16. A table driving apparatus as set forth in claim 15, wherein said casing comprises two sheets of metallic plates having a filler of pulverized granite and epoxy resins injected therebetween with a predetermined mixture ratio.

17. A table driving apparatus comprising:
a working table movable in at least one direction;
first direct-drive motor means mounted on the working table and having a first drive shaft;
means fixedly connected to the first drive shaft for picking up workpieces;
second direct-drive motor means having an operating frequency range and a second drive shaft;
means for mechanically coupling the working table to the second drive shaft to convert rotary movement of the drive shaft into linear movement of the working table along said at least one direction; and
wherein the coupling means is sufficiently stiff to establish a resonance frequency of a system comprised of the second direct-drive motor means and a load coupled therewith outside of the operating frequency range of the second direct-drive motor means.

18. A table driving apparatus as set forth in claim 17, wherein the first direct-drive motor means has an operating frequency range and is coupled with the picking up means with sufficient stiffness to effect a resonance frequency of a system including the first direct-drive motor means and a load coupled therewith which is outside of the operating frequency range of the first direct-drive motor means.

19. A table driving apparatus as set forth in claim 17, wherein the picking up means comprises a hand fixed in angular position relative to an arm connected to the first drive shaft independently of the rotation of the arm.

20. A table driving apparatus as set forth in claim 19, further comprising a third motor for driving the hand to any angular position relative to the arm.

* * * * *